United States Patent
MacMillan

(10) Patent No.: US 6,441,685 B1
(45) Date of Patent: Aug. 27, 2002

(54) AMPLIFIER CIRCUIT AND METHOD FOR PROVIDING NEGATIVE FEEDBACK THERETO

(75) Inventor: Bruce E. MacMillan, Phoenix, AZ (US)

(73) Assignee: JL Audio, Inc., Miramar, FL (US)

(*) Notice: Subject to any disclaimer, the term of this patent is extended or adjusted under 35 U.S.C. 154(b) by 0 days.

(21) Appl. No.: 09/528,454

(22) Filed: Mar. 17, 2000

(51) Int. Cl.⁷ ................................................ H03F 3/38
(52) U.S. Cl. ..................... 330/10; 330/251; 330/207 A
(58) Field of Search ............................. 330/10, 207 A, 330/251, 252, 275

(56) References Cited

U.S. PATENT DOCUMENTS

| | | | |
|---|---|---|---|
| 3,939,380 A | 2/1976 | Peer | 315/397 |
| 4,004,246 A | 1/1977 | Hamada | 330/10 |
| 4,042,890 A | 8/1977 | Eckerle | 330/207 A |
| 4,144,502 A | 3/1979 | Ikeda | 330/207 A |
| 4,178,556 A | 12/1979 | Attwood | 330/10 |
| 4,249,136 A | 2/1981 | Suzuki et al. | 330/251 |
| 4,326,170 A | 4/1982 | Levy | 330/10 |

(List continued on next page.)

FOREIGN PATENT DOCUMENTS

| | | |
|---|---|---|
| DE | 4328968 A1 | 3/1995 |
| JP | 406029757 A | 2/1994 |
| JP | 407221564 A | 8/1995 |
| JP | 407231226 A | 8/1995 |
| WO | WO 98/19391 | 5/1998 |
| WO | WO 98/44626 | 10/1998 |

OTHER PUBLICATIONS

Korea Advanced Institute of Science and Technology, Samsung Electronics Co., Ltd. Samsung Advanced Institute of Technology "A Class D Switching Power Amplifier With High Efficiency and Wide Bandwidth by Dual Feedback Loops", pp. 428–429, XP000547882, Published Jun. 7, 1995.

(List continued on next page.)

Primary Examiner—Tuan T. Lam
(74) Attorney, Agent, or Firm—Holland & Knight LLP

(57) ABSTRACT

An amplifier circuit (300, 400, 500) employs negative feedback and a method (600) for providing such feedback to reduce distortion and/or an output impedance of the amplifier circuit, without adversely impacting the overall stability of the amplifier circuit. The amplifier circuit includes a forward path and a feedback path. The forward path includes at least one amplifier (301, 305) arranged in series with an output lowpass filter (307). The amplifier receives a feedback-compensated input signal and amplifies the input signal to produce an amplified signal. The feedback path includes a lowpass filter (311), a highpass filter (313), and a summing arrangement (315) that selectively include and exclude the output lowpass filter from the feedback loop. The feedback lowpass filter is operably coupled to an output of the output lowpass filter and attenuates high frequency components of the amplifier circuit's output signal to produce a lowpass-filtered feedback signal. The highpass filter is operably coupled to an input of the output lowpass filter and attenuates low frequency components of the output filter's input signal to produce a highpass-filtered feedback signal. The two filtered feedback signals are summed by the summing arrangement to produce a composite feedback signal for application to the forward path amplifier or amplifiers.

18 Claims, 4 Drawing Sheets

U.S. PATENT DOCUMENTS

| | | | |
|---|---|---|---|
| 4,335,274 A | 6/1982 | Ayers | 179/1 F |
| 4,441,081 A | 4/1984 | Jenkins | 330/110 |
| 4,476,442 A | 10/1984 | Iwamatsu | 330/265 |
| 4,484,145 A | 11/1984 | Haulin | 330/9 |
| 4,509,101 A | 4/1985 | Kenji | 361/79 |
| 4,531,096 A | 7/1985 | Yokoyama | 330/10 |
| 4,980,649 A | 12/1990 | Gulczynski | 330/10 |
| 4,992,749 A | 2/1991 | Tokumo et al. | 330/10 |
| 5,160,896 A | 11/1992 | McCorkle | 330/251 |
| 5,315,266 A | 5/1994 | Lorez | 330/294 |
| 5,410,592 A | 4/1995 | Wagner et al. | 379/388 |
| 5,543,753 A | 8/1996 | Williamson | 330/297 |
| 5,610,553 A | 3/1997 | Kirn | 330/10 |
| 5,764,781 A | 6/1998 | Ding | 381/96 |
| 5,767,740 A * | 6/1998 | Fogg | 330/10 |
| 5,796,305 A | 8/1998 | Sondermeyer | 330/105 |
| 5,805,020 A | 9/1998 | Danz et al. | 330/10 |
| 5,838,193 A | 11/1998 | Myers et al. | 330/10 |
| 5,909,153 A | 6/1999 | Delano et al. | 332/107 |
| 5,949,282 A | 9/1999 | Nguyen et al. | 330/10 |
| 5,973,368 A | 10/1999 | Pearce et al. | 257/368 |
| 5,986,498 A | 11/1999 | Rodriguez | 330/10 |
| 6,016,075 A | 1/2000 | Hamo | 330/10 |

OTHER PUBLICATIONS

"Feedforward Error Correction in Power Amplifiers", Vanderkooy, J. and Lipshitz, S., Journal of the Audio Engineering Society, vol. 28, No. 1/2, Jan./Feb. 1980, pp. 2–16.

"High Fidelity PWM–Based Amplifier Concept for Active Loudspeaker Systems With Very Low Energy Consumption", Nielsen, K., Journal of the Audio Engineering Society, vol. 45, No. 7/8, Jul./Aug. 1997, pp. 554–570.

"High Fidelity Pulse Width Modulation Amplifiers Based on Novel Double Loop Feedback Techniques", Anderskouv, N., Nielsen, K. & Andersen, M., Audio Enigineering Society 100$^{th}$ Convention, May 11–14, 1996, Copenhagen, Denmark, Preprint No. 4258 (Q–3), pp. 1–17.

"High Fidelity PWM Based Amplifier Concept for Active Speaker Systems with a Very Low Energy Consumption", Nielsen, K., Audio Engineering Society 100$^{th}$ Convention, May 11–14, 1996, Copenhagen, Denmark, Preprint No. 4259 (Q–4), pp. 1–27.

"A Review and Comparison of Pulse Width Modulation (PWM) Methods for Analog and Digital Input Switching Power Amplifiers", Nielsen, K., Audio Engineering Society 102$^{nd}$ Convention , Mar. 22–25, 1997, Munich, Germany, Preprint No. 4446 (G4), pp. 1–57.

"Parallel Phase Shifted Carrier Pulse Width Modulation (PSCPWM)—A Novel Approach to Switching Power Amplifier Design", Nielsen, K., Audio Engineering Society 102$^{nd}$ Convention, Mar. 22–25, 1997, Munich, Germany, Preprint No. 4447 (G5), pp. 1–26.

"Pulse Edge Delay Error Correction (PEDEC)—A Novel Power Stage Error Correction Principle for Power Digital–Analog Conversion", Nielsen, K., Audio Engineering Society 103$^{nd}$ Convention, Sep. 26–29, 1997, New York, New York Preprint No. 4603 (N–7), pp. 1–30 and Figures 1–29.

"Comparing Nonlinear With Linear Control Methods for Error Correction in Switching Audio Amplifier Output Stages", Nielsen, K., Taul, T., & Anderson, M., Audio Engineering Society 104$^{th}$ Convention, May 16–19, 1999, Amsterdam, The Netherlands, Preprint No. 4673 (P13–8), pp. 1–43.

"Linearity and Efficiency Performance of Switching Audio Power Amplifier Output Stages—A Fundamental Analysis", Nielsen, K., Audio Engineering Society 105$^{th}$ Convention, Sep. 26–29, 1998, San Francisco, California, Preprint No. 4838 (E–4), pp. 1–25 and Figures 1–19.

"Introduction to Electroacoustics and Audio Amplifier Design", Leach, Jr., W., Second Edition, Kendall/Hunt Publishing Company, 1999, pp. 271–288.

"MECC—A Novel Control Method for High End Switching Audio Power Amplification", Nielsen, K., Audio Engineering Society 105$^{th}$ Convention, Sep. 26–29, 1998, San Francisco, California, Preprint No. 4839 (E–5), pp. 1–16 and Figures 1–15.

"Parallel Phase Shifted Carrier Pulse Width Modulation (PSCPWM) Schemes—A Fundamental Analysis", Christensen, F., Frederiksen, T., & Nielsen, K., Audio Engineering Society 106$^{th}$ Convention, May 8–11, 1999, Munich, Germany, Preprint No. 4917 (J3), pp. 1–19 and Figures 1–31.

"Digital Pulse Modulation Amplifier (PMA) Topologies Based on PEDEC Control", Nielsen, K., Audio Engineering Society 106$^{th}$ Convention, May 8–11, 1999, Munich, Germany, Preprint No. 4942 (O2), pp. 1–25.

"A Review and Comparison of Digital PWM Methods for Digital Pulse Modulation Amplifier (PMA) Systems", Johansen, M. and Nielsen, K., Audio Engineering Society 107$^{th}$ Convention, Sep. 24–27, 1999, New York, New York, Preprint No. 5039 (L–4), pp. 1–18 and Figures 1–18.

"Practical Implementation and Error Analysis of PSCPWM Based Switching Audio Power Amplifiers", Christensen, F., Frederiksen, T., Anderson, M., & Nielsen, K., Audio Engineering Society 107$^{th}$ Convention, Sep. 24–27, 1999, New York, New York, Preprint No. 5040 (L–5), pp. 1–15 and Figures 1–19.

* cited by examiner

AMPLIFIER CIRCUIT AND METHOD FOR PROVIDING NEGATIVE FEEDBACK THERETO

FIELD OF THE INVENTION

The present invention relates generally to amplifier circuits and, in particular, to providing negative feedback to an amplifier circuit that includes an output lowpass filter.

BACKGROUND OF THE INVENTION

Class D power amplifiers are well-known amplifiers for use in audio applications. Such amplifiers commonly use a lowpass filter between an output switching power stage and the load (e.g., speaker) to substantially eliminate a majority of the high-frequency components of the switched power signal, thereby leaving the desired audio signal. Class D amplifiers also commonly use negative feedback to reduce the distortion and output impedance of the amplifier.

Negative feedback in a class D amplifier is commonly accomplished by feeding back either the input signal to the output lowpass filter or the output signal of the output lowpass filter. A conventional class D amplifier 100 in which the input signal to the output lowpass filter 107 is fed back is depicted in electrical block diagram form in FIG. 1. The amplifier 100 includes an error amplifier 101, a pulse width modulator (PWM) 103, and an output amplification stage 105. The amplifier 100 drives a load 109, such as an audio speaker. A single-pole lowpass filter 111 may be optionally inserted in the feedback path to remove some of the high switching frequency components of the output signal of the output stage 105 from the feedback signal 115. The feedback approach depicted in FIG. 1 avoids feedback loop instability problems that may result when the feedback signal 115 is taken from the output of the output lowpass filter 107, such instabilities being due to the phase shift and amplitude peaking of the filter 107. The drawback of the amplifier circuit 100 of FIG. 1 is that the output lowpass filter 107 is outside of the feedback loop, so any low frequency, non-ideal behavior of the filter 107 is not corrected by the feedback and thus degrades amplifier performance.

A conventional class D amplifier 200 in which the output signal of the output lowpass filter 107 is fed back is depicted in electrical block diagram form in FIG. 2. In this circuit 200, the feedback is taken from the actual output of the amplifier 200. With the approach of FIG. 2, the output filter 107 is within the feedback loop. Thus, the output filter's non-ideal behavior can be corrected by the feedback loop in order to reduce the performance degradation normally introduced by the filter 107. In practice, however, the approach depicted in FIG. 2 is difficult to apply and requires compromises which degrade other aspects of amplifier circuit performance.

Because the output lowpass filter 107 is within the feedback loop in the circuit 200 of FIG. 2, the filter's phase shift and amplitude response must be accounted for when compensating the feedback loop to ensure amplifier stability. When used, the output lowpass filter 107 is typically implemented to have a transfer function with two or more poles. More than one pole is typically necessary to provide acceptable attenuation of the high-frequency components present in the output stage's output signal, without significant attenuation of desired audio frequencies. Thus, the output filter 107 adds at least ninety degrees (90°), and typically adds one hundred eighty degrees (180°) or more, of phase shift at some particular frequency to the open-loop phase shift of the amplifier circuit 200. Such substantial open-loop phase shift makes feedback loop compensation difficult because general engineering practice restricts the total open-loop phase shift to a maximum of one hundred thirty-five degrees (135°) at the unity loop-gain crossover frequency.

One approach that is conventionally used to compensate for the effects of the output lowpass filter 107 when the filter 107 is within the feedback loop is the insertion of a phase compensation network 201 into the feedback path as shown in FIG. 2. The phase compensation network 201 cancels at least some of the phase shift introduced by the output filter 107. However, the phase compensation provided by the phase compensation network 201 only works over a narrow range of frequencies and requires that the phase and amplitude responses of the output filter 107 be known and vary within known limits under all operating conditions.

Moreover, the phase and amplitude responses of the output filter 107 are dependent upon the impedance of the load 109. Consequently, when the impedance of the load 109 is not under the control of the amplifier circuit designer, such as when the amplifier circuit 200 is sold as a stand-alone unit, a priori knowledge of the phase and amplitude responses of the output filter 107 is at best difficult, if not impossible, to estimate.

Furthermore, use of a phase compensation network 201 is typically only effective for compensating phase shifts introduced by output lowpass filters 107 having transfer functions with one or two poles. Thus, the use of a feedback phase compensation network 201 is inadequate for compensating desirable higher-order filters that provide greater attenuation of the high-frequency components of the output stage's output signal.

As an alternative to utilizing a feedback phase compensation network 201, the open-loop bandwidth of the amplifier circuit 200, excluding the output lowpass filter 107, can be reduced such that the unity loop-gain crossover frequency falls below the frequency at which the output lowpass filter 107 adds enough phase shift to cause loop instability. However, such a bandwidth limitation severely restricts the operating frequency range of the amplifier circuit 200 and reduces the available loop gain at operating frequencies, thereby increasing distortion and output impedance as compared to using the feedback phase compensation network 201.

Therefore, a need exists for an amplifier circuit and method of providing feedback thereto that effectively removes the output lowpass filter from the feedback loop at high frequencies, thereby eliminating the drawbacks associated with either the use of a feedback phase compensation network or limiting the open-loop bandwidth of the amplifier circuit, and includes the output lowpass filter in the feedback loop at low frequencies to enable the feedback loop to correct for the non-ideal behavior of the filter.

DETAILED DESCRIPTION OF A PREFERRED EMBODIMENT

Generally, the present invention encompasses an amplifier circuit that includes negative feedback and a method for providing negative feedback to an amplifier circuit. An amplifier circuit includes a forward path and a feedback path. The forward path includes at least one amplifier arranged in series with an output lowpass filter. The forward path amplifier receives a feedback-corrected input signal and amplifies the input signal to produce an amplified signal. The feedback path includes a lowpass filter, a highpass filter, and a summing arrangement. The feedback lowpass filter is operably coupled to an output of the forward path's output lowpass filter and attenuates high frequency components of the amplifier circuit's output signal to produce a lowpass-filtered feedback signal. The feedback highpass filter is operably coupled to an input of the forward path's output lowpass filter and attenuates low frequency components of the output filter's input signal to produce a highpass-filtered feedback signal. The two filtered feedback signals are summed by the summing arrangement to produce a composite feedback signal that provides negative feedback to the amplifier circuit.

By providing negative feedback to an amplifier in this manner, the present invention enables the output lowpass filter of a class D amplifier circuit to be included in the feedback loop at low frequencies (effectively below the cutoff frequency of the feedback lowpass filter) and removed from the feedback loop at high frequencies (effectively above the cutoff frequency of the feedback highpass filter), in sharp contrast to prior art feedback approaches which either simply remove the output filter from the class D amplifier's feedback loop altogether or attempt the difficult task of compensating for the phase shift introduced by the output filter at high frequencies. The present invention feeds back both the input signal to and the output signal from the output lowpass filter and combines these two feedback signals in a frequency-selective way to include the output filter within the feedback loop at low (e.g., audio) frequencies and remove the output filter from the feedback loop at high (e.g., above audio band) frequencies. With such a feedback approach, the present invention accounts for the non-ideal, low frequency behavior of the output filter, without incurring high frequency instabilities typically present in prior art amplifier circuits that include the output filter in the feedback loop. Thus, the feedback method of the present invention facilitates use of output lowpass filters having transfer function orders greater than two without introducing feedback loop instabilities.

Figure 1:
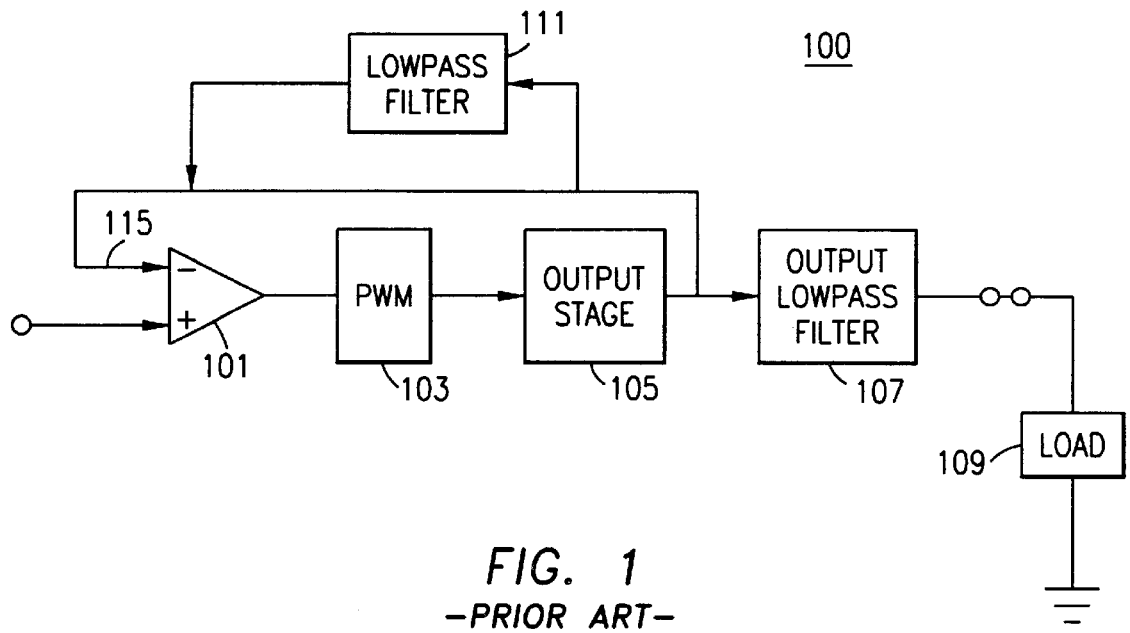
FIG. 1 is an electrical block diagram of a prior art class D audio amplifier circuit employing negative feedback taken from an input of the output lowpass filter of the amplifier circuit.
Figure 2:
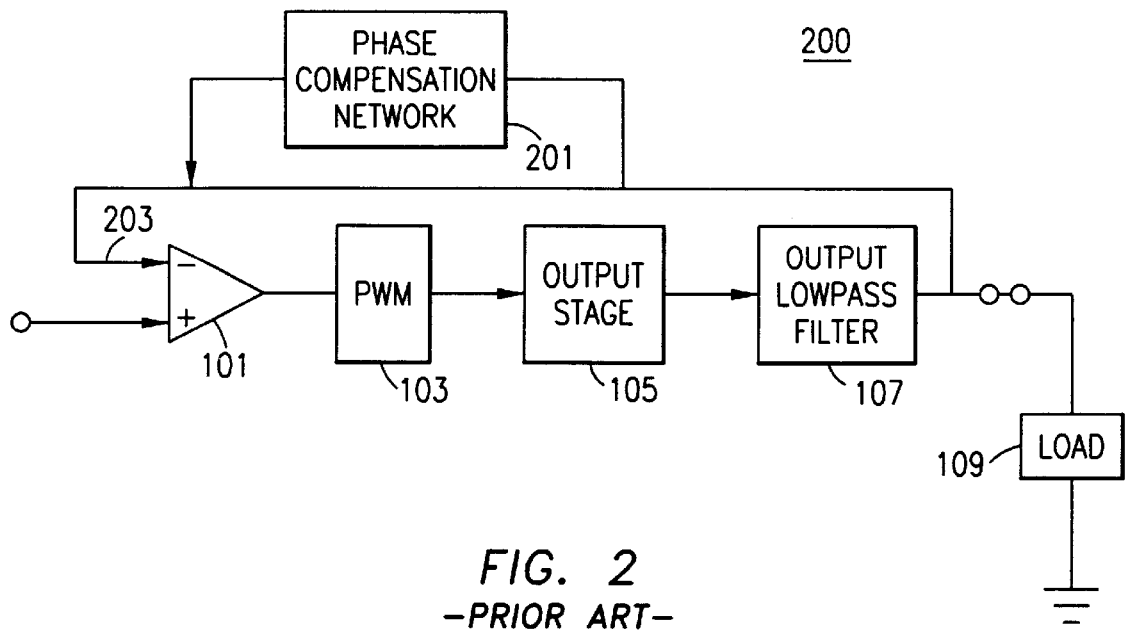
FIG. 2 is an electrical block diagram of another prior art class D audio amplifier circuit employing negative feedback taken from an output of the output lowpass filter of the amplifier circuit.
Figure 3:
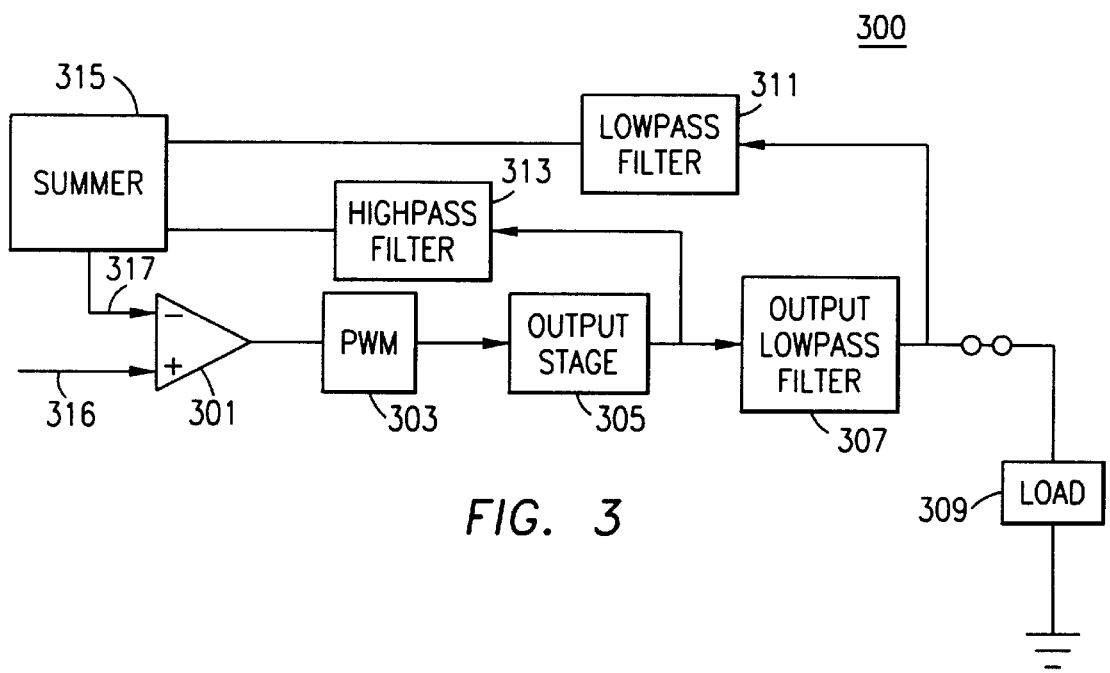
FIG. 3 is an electrical block diagram of an amplifier circuit employing negative feedback in accordance with the present invention.
Figure 4:
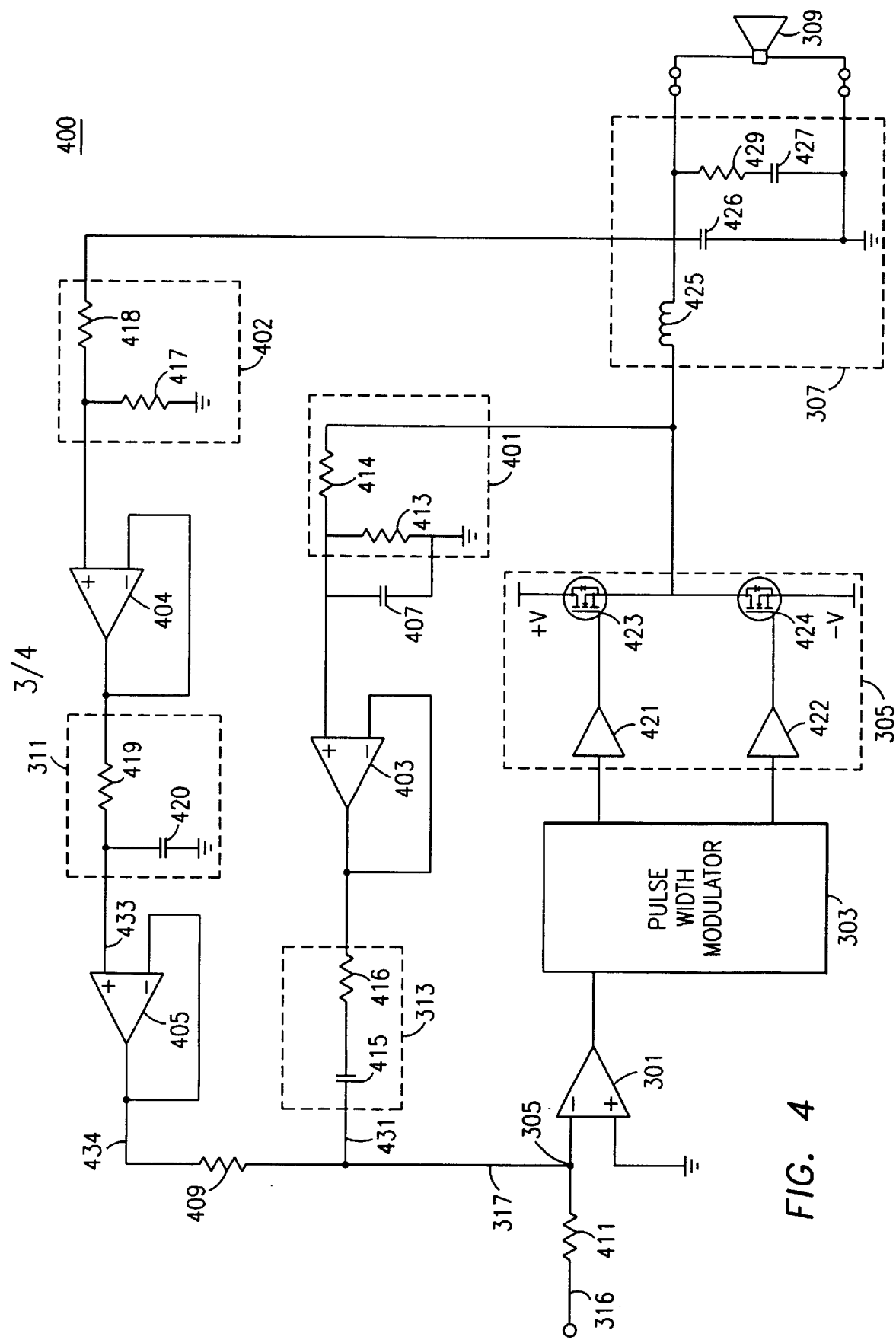
FIG. 4 is a schematic and electrical block diagram of an amplifier circuit employing negative feedback in accordance with a preferred single-ended output embodiment of the present invention.
Figure 5:
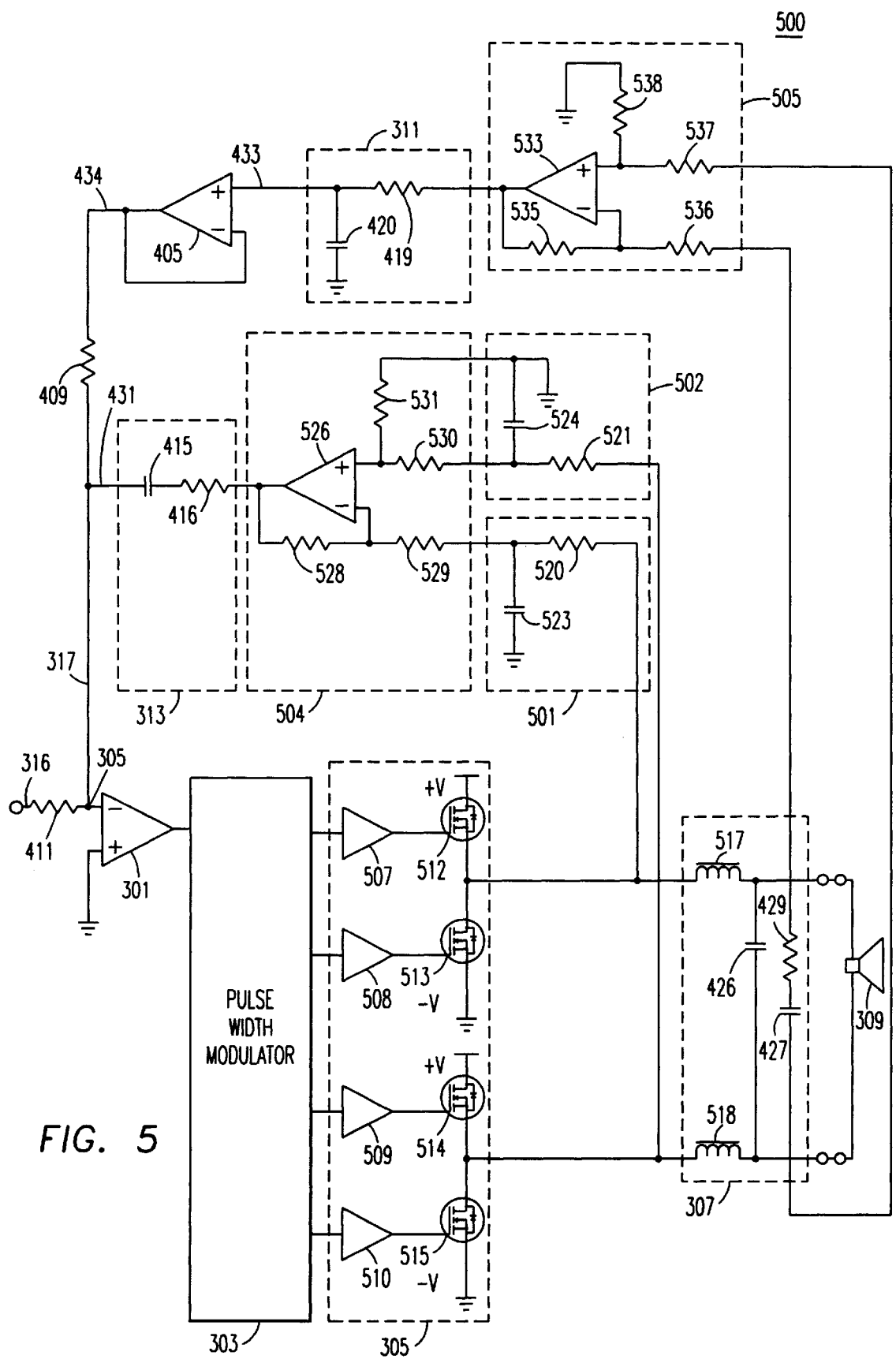
FIG. 5 is a schematic and electrical block diagram of an amplifier circuit employing negative feedback in accordance with a preferred balanced output embodiment of the present invention.

The present invention can be more fully understood with reference is to FIGS. 3–6, in which like reference numerals designate like items. FIG. 3 is an electrical block diagram of an amplifier circuit 300 employing negative feedback in accordance with the present invention. The amplifier circuit 300 includes a forward path and a feedback path. The forward path includes an error amplifier 301, a pulse-width modulator (PWM) 303, an output amplification stage 305, and an output lowpass filter 307. The feedback path includes a feedback lowpass filter 311, a feedback highpass filter 313, and a summing arrangement 315. Preferred embodiments of the error amplifier 301, the output stage 305, the output lowpass filter 307, the feedback lowpass filter 311, the feedback highpass filter 313, and the summing arrangement 315 are depicted in FIGS. 4 and 5, and are described in detail below. The PWM 303 comprises a conventional pulse-width modulator.

Operation of the amplifier circuit 300 of FIG. 3 occurs substantially as follows in accordance with the present invention. The error amplifier 301 receives an input signal 316 and a feedback signal 317 and produces an output error signal proportional to a difference between the received signals 316, 317. The error signal is input to the PWM 303 and controls the pulse width of the output of the PWM 303 in accordance with known techniques. The pulse-width modulated output of the PWM 303 is then applied as an input signal to the output amplifier stage 305. The output amplifier stage 305 amplifies the pulse-width modulated input signal and the amplified, or more conventionally switched-power, signal produced by the output stage 305 is applied as an input signal to the output lowpass filter 307 and as a feedback signal to the feedback highpass filter 313. The output of the output lowpass filter 307 (i.e., the actual output signal of the amplifier circuit 300) is applied to the load 309 (e.g., a speaker) and as a feedback signal to the feedback lowpass filter 311. The outputs of the feedback lowpass filter 311 and the feedback highpass filter 313 are summed together in the summing arrangement 315 (e.g., a summing node or a summing amplifier). The output of the summing arrangement 315 is the composite feedback signal 317 that is input to the error amplifier 301 for comparison with the input signal 316 in accordance with known techniques.

The feedback lowpass filter 311 and the feedback highpass filter 313 have approximately equal passband gain and approximately the same cutoff frequency. As is known, the cutoff frequency is the frequency at which the filter attenuation is three decibels (3 dB) and typically defines one end of the lowpass filter's or highpass filter's passband.

In addition to having substantially equivalent passband gain, the phase and amplitude responses of the feedback lowpass filter 311 and the feedback highpass filter 313 are chosen such that, if each filter 311, 313 were to receive the same input signal, the summation of their output signals is substantially identical to the input signal. Preferred embodiments of the feedback filters 311, 313 are depicted in FIG. 4 and have component values as set forth in Table 1 below. The cutoff frequencies of the feedback lowpass filter 311 and the feedback highpass filter 313 are substantially lower than (e.g., one-tenth to one-fifth) the cutoff frequency of the output lowpass filter 307. For example, if the cutoff frequency of the output lowpass filter 307 is ten (10) kHz (i.e., the upper end of the audio range), the cutoff frequency of each of the feedback filters 311, 313 is preferably one (1) kHz. The cutoff frequencies of the feedback filters 311, 313 are preferably substantially lower than the cutoff frequency of the output lowpass filter 307 to ensure that the output of the feedback lowpass filter 311 does not adversely affect the feedback loop response at frequencies where the output lowpass filter 307 has significant phase shift.

The summing arrangement 315 preferably applies the same gain to both the output of the feedback lowpass filter 311 and the output of the feedback highpass filter 313. When the summing arrangement 315 is simply a summing node, the gain applied by the summing arrangement 315 to both filtered feedback signals is one (i.e., 0 dB).

FIG. 4 is a schematic and electrical block diagram of an amplifier circuit 400 employing negative feedback in accordance with a preferred single-ended output embodiment of the present invention. In this embodiment, the preferred amplifier circuit 400 is a class D audio amplifier circuit that includes all the elements depicted in block diagram form in FIG. 3 together with implementation-specific voltage dividers 401, 402, buffer amplifiers 403–405, resistors 409, 411, and capacitor 407. Therefore, similar to the amplifier circuit 300 of FIG. 3, the amplifier circuit 400 of FIG. 4 includes a forward path and a feedback arrangement. The forward path includes the error amplifier 301, the PWM 303, the output amplification stage 305, and the output lowpass filter 307. The feedback arrangement includes two voltage dividers 401, 402, three buffer amplifiers 403–405, the feedback lowpass filter 311, the feedback highpass filter 313, the summing arrangement 315, a summation-weighting resistor 409, and filtering. capacitor 407.

With respect to the preferred embodiment of the feedback arrangement, each voltage divider 401, 402 includes two resistors 413–414, 417–418 arranged in a conventional manner as shown. The feedback lowpass filter 311 preferably comprises a resistor 419 and a capacitor 420 arranged as shown and having respective values as set forth in Table 1 below and has a cutoff frequency of approximately one-tenth the cutoff frequency of the output lowpass filter 307. The feedback highpass filter 313 preferably comprises a resistor 416 and a capacitor 415 connected in series as shown and having respective values as set forth in Table 1 below and has a cutoff frequency substantially equal to the cutoff frequency of the feedback lowpass filter 311 and approximately one-tenth the cutoff frequency of the output lowpass filter 307. The buffer amplifiers 403–405 preferably comprise operational amplifiers configured to provide unity gain.

With respect to the preferred embodiments of the forward path components, the error amplifier 301 preferably comprises an operational amplifier arranged in an inverting configuration as depicted in FIG. 4 with gain setting resistor 411. The PWM 303 comprises a conventional PWM. The preferred output amplifier stage 305 includes two driver circuits 421, 422 driving respective switching devices 423, 424. The switching devices 423, 424 preferably comprise metal oxide field effect transistor (MOSFET) stages arranged in a half-bridge configuration with a switching frequency of approximately fifty (50) kHz. As is known, a half-bridge configuration employs two switching devices 423, 424 in series that are turned on and off alternately. The switched output of the amplifier stage 305 employing the half-bridge configuration appears between AC ground and the common connection node between the two switching devices 423, 424. AC ground may be either one-half the value of a single DC supply voltage (e.g., when such a single DC supply voltage is used to provide DC power to both switching devices 423, 424) or DC ground (e.g., in the event that symmetrical positive (+V) and negative (−V) DC supply voltages are used to provide DC power to the switching devices 423, 424 as depicted in FIG. 4). The terminals of each switching device 423, 424 that are not common (i.e., connected to each other) connect to either a DC supply voltage or ground.

The output lowpass filter 307 preferably comprises two capacitors 426, 427, an inductor 425, and a resistor 429 arranged as shown and having respective values as set forth in Table 1 below. Although not shown in FIG. 4, each driver circuit 421, 422 and switching device 423, 424 may include input and output matching circuitry, and DC de-coupling and filtering circuitry in accordance with well-known amplifier stage design techniques.

The output lowpass filter 307 has a cutoff frequency of approximately five (5) kHz. The preferred summing arrangement 305 comprises the virtual ground feedback summing node indicated in FIG. 4. Such virtual ground summing is an inherent function of an operational amplifier configured as an inverting amplifier with its non-inverting input connected to ground.

Operation of the preferred amplifier circuit 400 occurs as follows in accordance with the present invention. A first feedback signal is taken from the input to the output lowpass filter 307 and is attenuated by voltage divider 401. The combination of capacitor 407 and resistors 413 and 414 form a lowpass filter with a corner frequency of approximately one-tenth to one-fifth of the switching frequency of the output stage 305. The optional filter significantly attenuates a majority of the high frequency components of the input signal to the output lowpass filter 307. Such high frequency components, if not attenuated, may overload the feedback circuits, resulting in amplifier distortion.

The attenuated and filtered signal at the output of voltage divider 401 and the optional filter is connected to the non-inverting input of buffer amplifier 403. The buffer amplifier 403 isolates the voltage divider 401 and the optional filter from the loading effects of the feedback highpass filter 313. The buffered first feedback signal is then filtered by the feedback highpass filter 313 to produce a highpass-filtered feedback signal 431. The highpass-filtered feedback signal 431 is provided to the summing arrangement 305, which in turn is coupled to the inverting input of the error amplifier 301.

A second feedback signal is taken from the output of the output lowpass filter 307 (i.e., the output of the amplifier circuit 400) and is attenuated by voltage divider 402. The attenuated signal is connected to the non-inverting input of buffer amplifier 404. Buffer amplifier 404 isolates voltage divider 402 from the loading effect of the feedback lowpass filter 311. The buffered second feedback signal is then filtered by the feedback lowpass filter 311 to produce a lowpass-filtered feedback signal 433. The lowpass-filtered feedback signal 433 is provided to the non-inverting input of buffer amplifier 405. Buffer amplifier 405 isolates the feedback lowpass filter 311 from the loading effects of summation-weighting resistor 409, which is preferably connected to the output of buffer amplifier 405. The buffered, lowpass-filtered feedback signal 434 is provided to the summing arrangement 305 through summation-weighting resistor 409. The summing arrangement 305 sums the highpass filtered feedback signal 431 and the buffered, lowpass-filtered feedback signal 434 to produce a composite feedback signal 317. The composite feedback signal 317 is then combined with the amplifier circuit's input signal 316 to produce the input signal to the error amplifier 301, and thereby apply negative feedback to the amplifier circuit 400.

In the preferred embodiment, the respective resistance and capacitance values of resistors 416, 419 and capacitors 415, 420 in the feedback lowpass filter 311 and the feedback highpass filter 313 are chosen such that the product of the resistance of resistor 419 and the capacitance of capacitor 420 is equal to the product of the resistance of resistor 416 and the capacitance of capacitor 415. By selecting the values of the resistances and capacitances in this manner, the two filters 311, 313 have substantially identical cutoff frequencies, thereby causing the sum of their outputs (i.e., the composite feedback signal 317) to have a constant amplitude for varying frequency inputs in the event that the filters 311, 313 are connected at their respective inputs.

The filtered feedback signals 431, 433 are summed as signal currents at the summing node 305, which is also the inverting input of the error amplifier 301. The inverting input of the error amplifier 301 is a virtual ground due to the inverting amplifier configuration of the preferred error amplifier 301. At the frequency at which the impedance of capacitor 415 equals the impedance of resistor 416 and the impedance of capacitor 420 equals the impedance of resistor 419, the two filtered feedback signals 431, 433 have equal amplitudes and contribute equally to the composite feedback signal 317. At lower frequencies, where the impedances of capacitors 415 and 420 are much greater than the impedances of resistors 416 and 419, respectively, the composite feedback signal 317 consists primarily of the buffered, lowpass-filtered feedback signal 434. In this case, the impedance of resistor 409 is much less than the impedance of the series combination of capacitor 415 and resistor 416. At higher frequencies, where the impedances of capacitors 415 and 420 are much less than the impedances of resistors 416 and 419, respectively, the composite feedback signal 317 consists primarily of filtered feedback signal 431. That is, at higher frequencies, the feedback lowpass filter 311 (and therefore also buffer amplifier 405) has essentially no output signal. Consequently, very little feedback signal current flows through summation-weighting resistor 409 at higher frequencies.

Therefore, with the feedback arrangement depicted in either FIG. 3 or FIG. 4, the composite feedback signal 317 is derived primarily from the output signal of the output lowpass filter 307 for frequency components below the common cutoff frequency of the feedback filters 311, 313 and is derived primarily from the input signal to the output lowpass filter 307 for frequency components above the common cutoff frequency of the feedback filters 311, 313. As a result, the output lowpass filter 307 is within the amplifier feedback loop at lower frequencies and, therefore, any non-ideal behavior of the filter 307 can be corrected by the feedback loop. On the other hand, the output lowpass filter 307 is outside of the feedback loop at higher frequencies and, therefore, its phase and amplitude response has little effect on the overall stability of the amplifier circuit 300, 400.

The preferred embodiment of the output lowpass filter 307 comprises a second order filter with a high frequency damping network. The filtering function of the output lowpass filter 307 is performed primarily by inductor 425 and capacitor 426. If the output lowpass filter 307 consisted solely of inductor 425 and capacitor 426, the filter 307 would have a large quality factor (Q) and an associated peak in its amplitude response at its resonant frequency when the filter 307 was not terminated into a fully or partially resistive load. Because the output lowpass filter 307 is within the feedback loop at low frequencies, such an amplitude peak could offset some of the attenuation introduced by the feedback lowpass filter 311 at the output filter's resonant frequency and could thus cause an instability of the amplifier circuit 400 at the resonant frequency of the output lowpass filter 307. To prevent such an instability, a damping network consisting of resistor 429 and capacitor 427 is included in the preferred output lowpass filter 307 to reduce the Q of the filter 307 when the filter 307 is not loaded with a resistive load 309 (e.g., a speaker).

Although the preferred amplifier circuit 400 includes only a second-order output lowpass filter 307, the amplifier circuit arrangement of the present invention is capable of utilizing higher order (i.e., orders greater than two) output filters without any degradation in amplifier circuit stability, provided that such a higher-order filter includes a damping network, such as the network formed by resistor 429 and capacitor 427, to reduce the filter's unloaded quality factor (Q) and reduce the magnitude of the filter's unloaded frequency response peak. In the event that such a higher-order filter is utilized, the cutoff frequencies of the feedback lowpass filter 311 and feedback highpass filter 313 should be chosen such that the feedback lowpass filter 311 has insignificant output at frequencies where the phase shift of the output lowpass filter 307 is significant (e.g., greater than forty-five (45) degrees).

Table 1 below is a parts listing for the preferred amplifier circuit 400 of FIG. 4.

TABLE 1

| Reference Numeral(s) | Part Description | Quantity | Manufacturer | Manufacturer's Part Number |
|---|---|---|---|---|
| 413, 417 | 1000 Ω, ¼ Watt, 5% Resistor | 2 | Ohmite Manufacturing Company Skokie, IL | 0D102J |
| 411, 414, 418 | 10 KΩ, ¼ Watt, 5% Resistor | 3 | Ohmite Manufacturing Company Skokie, IL | 0D103J |
| 409, 416, 419 | 22 kΩ, ¼ Watt, 5% Resistor | 3 | Ohmite Manufacturing Company Skokie, IL | 0D223J |
| 429 | 10 Ω, ¼ Watt, 5% Resistor | 1 | Ohmite Manufacturing Company Skokie, IL | 0D100J |
| 407, 415, 420 | 0.015 μF, 250 Volt, 10% Capacitor | 3 | Illinois Capacitor, Inc. Lincolnwood, IL | 153MSR250K |
| 426 | 10 μF, 100 Volt, 10% Capacitor | 1 | Illinois Capacitor, Inc. Lincolnwood, IL | 106MSR100K |
| 427 | 4.7 μF, 100 Volt, 10% Capacitor | 1 | Illinois Capacitor, Inc. Lincolnwood, IL | 475MSR100K |
| 425 | 100 μH, 12 Amp Inductor | 1 | Caddell-Burns Mineola, NY | 7000-13 |
| 301, 403–405 | Quad Operational Amplifier | 1 | National Semiconductor, Inc. Santa Clara, CA | LM837 |
| 421, 422 | Half-bridge Driver | 1 | International Rectifier El Segundo, CA | 1R2110 |
| 423, 424 | N-Channel MOSFET | 2 | International Rectifier El Segundo, CA | 1RF540 |

FIG. 5 is a schematic and electrical block diagram of an amplifier circuit 500 employing negative feedback in accordance with a preferred balanced output embodiment of the present invention. In this embodiment, the preferred amplifier circuit 500 is a class D audio amplifier circuit that includes all the elements depicted in block diagram form in FIG. 3 together with implementation-specific lowpass filters 501, 502 and differential amplifiers 504, 505. Therefore, similar to the amplifier circuit 300 of FIG. 3, the amplifier circuit 500 of FIG. 5 includes a forward path and a feedback arrangement. The forward path includes the error amplifier 301, the PWM 303, the output amplification stage 305, and the output lowpass filter 307. However, in this embodiment, the output amplifier stage 305 comprises a conventional H-bridge or full bridge operating from a single DC voltage supply (+V). The H-bridge output amplifier stage 305 includes a plurality of is driver circuits 507–510 driving respective switching devices 512–515. The switching devices 512–515 preferably comprise MOSFETs and the output stage 305 preferably operates at a switching frequency of approximately fifty (50) kHz. As is known, the H-bridge consists of two half bridges that share a common power supply voltage or voltages. The switching devices 512–515 in each half bridge switch alternately and in common with the diagonally-opposed switching device of the other half bridge. For example, switching devices 512 and 515 will be "on" while switching devices 513 and 514 are "off." Similarly, when the bridge changes states, switching devices 513 and 514 will be "on" while switching devices 512 and 515 are "off."

The switched outputs of the switching devices 512–515 appear between the switching-device common terminals of the two half bridges and are balanced with respect to ground, in contrast to being single-ended (i.e., ground-referenced) as in the circuit 400 of FIG. 4. As a consequence, the single series inductor 425 of the output lowpass filter of FIG. 4 is replaced with two series inductors 517, 518 as shown, each of which has an inductance of approximately one-half the inductance of inductor 425 in accordance with known techniques. Although not shown in FIG. 5, each driver circuit 507–510 and switching device 512–515 may include input and output matching circuitry, and DC de-coupling and filtering circuitry in accordance with well-known amplifier stage design techniques.

The feedback arrangement in this embodiment includes two lowpass filters 501, 502, two differential amplifiers 504, 505, buffer amplifier 405, the feedback lowpass filter 311, the feedback highpass filter 313, the summing arrangement 305, and a summation-weighting resistor 409. In this embodiment, the input to the output lowpass filter 307 is fed back in balanced form to the two complementary lowpass filters 501, 502. Each lowpass filter 501, 502 preferably comprises a series resistor 520, 521 and a shunt capacitor 523, 524. The two lowpass filters 501, 502 preferably have cutoff frequencies that are approximately one-tenth to one-fifth of the switching frequency of the output stage 305. The filters 501, 502 collectively operate in a manner similar to the operation of the lowpass filter of FIG. 4 consisting of resistors 413 and 414 and capacitor 406, and significantly attenuate a majority of the high frequency components that are present in the input signal to the output lowpass filter 307. Such high frequency components, if not attenuated, may overload the feedback circuits, resulting in amplifier distortion.

The outputs of filters 501 and 502 provide the differential inputs to differential amplifier 504. Differential amplifier 504 includes an operational amplifier 526 and conventionally arranged resistors 528–531. Differential amplifier 504 operates in a conventional manner to buffer and attenuate the output signals of lowpass filters 501, 502. In addition, differential amplifier 504 converts its balanced input signals to a single-ended output signal for application to the feedback highpass filter 313.

The output of the output lowpass filter 307 is also fed back in balanced form, but to differential amplifier 505 instead of lowpass filters 501 and 502. Similar to differential amplifier 504, differential amplifier 505 includes an operational amplifier 533 and conventionally arranged resistors 535–538, and operates in a conventional manner to buffer and attenuate its input signals (i.e., the balanced output signals of the output lowpass filter 307). In addition, differential amplifier 505 converts its balanced input signals to a single-ended output signal for application to the feedback lowpass filter 311. The output 433 of the feedback lowpass filter 311 is then buffered and combined with the output 431 of the feedback highpass filter 313 to produce the composite feedback signal 317 as described above with respect to FIG. 4. Therefore, except for the implementation differences in the feedback arrangement and the output lowpass filter 307 associated with providing a balanced output from the output amplifier stage 305, the amplifier circuit 500 of FIG. 5 functions in a manner substantially identical to the operation of the amplifier circuit 400 of FIG. 4.

Table 2 below is a parts listing for the preferred amplifier circuit 500 of FIG. 5.

TABLE 2

| Reference Numeral(s) | Part Description | Quantity | Manufacturer | Manufacturer's Part Number |
|---|---|---|---|---|
| 411 | 10 kΩ, ¼ Watt, 5% Resistor | 1 | Ohmite Manufacturing Company Skokie, IL | OD103J |
| 409, 416, 419 | 22 kΩ, ¼ Watt, 5% Resistor | 3 | Ohmite Manufacturing Company Skokie, IL | OD223J |
| 429 | 10 Ω, ¼ Watt, 5% Resistor | 1 | Ohmite Manufacturing Company Skokie, IL | OD100J |
| 520, 521 | 2.2 kΩ, 2 Watt, 5% Resistor | 2 | Ohmite Manufacturing Company Skokie, IL | OX222K |
| 528, 531, 535, 538 | 2.21 kΩ, ¼ Watt, 1% Resistor | 4 | Vishay Intertechnology, Inc. Malvern, PA | CMF55-2211FT-00 |
| 529, 530 | 20 kΩ, ¼ Watt, 1% Resistor | 2 | Vishay Intertechnology, Inc. Malvern, PA | CMF55-2002FT-00 |
| 536, 537 | 22.1 kΩ, ¼ Watt, 1% Resistor | 2 | Vishay Intertechnology, Inc. Malvern, PA | CMF55-2212FT-00 |
| 415, 420, 523, 524 | 0.015 μF, 250 Volt, 10% Capacitor | 4 | Illinois Capacitor, Inc. Lincolnwood, IL | 153MSR250K |
| 426 | 10 μF, 100 Volt, 10% Capacitor | 1 | Illinois Capacitor, Inc. Lincolnwood, IL | 106MSR100K |
| 427 | 4.7 μF, 100 Volt, 10% Capacitor | 1 | Illinois Capacitor, Inc. Lincolnwood, IL | 475MSR100K |
| 517, 518 | 50 μH, 15 Amp Inductor | 2 | Caddell-Burns Mineola, NY | 7000-09 |
| 301, 405, 526, 533 | Quad Operational Amplifier | 1 | National Semiconductor, Inc. Santa Clara, CA | LM837 |
| 507–508, 509–510 | Half Bridge Driver | 2 | International Rectifier El Segundo, CA | IR2110 |

TABLE 2-continued

| Reference Numeral(s) | Part Description | Quantity | Manufacturer | Manufacturer's Part Number |
|---|---|---|---|---|
| 512–515 | N-Channel MOSFET | 4 | International Rectifier El Segundo, CA | IRF540 |

Figure 6:
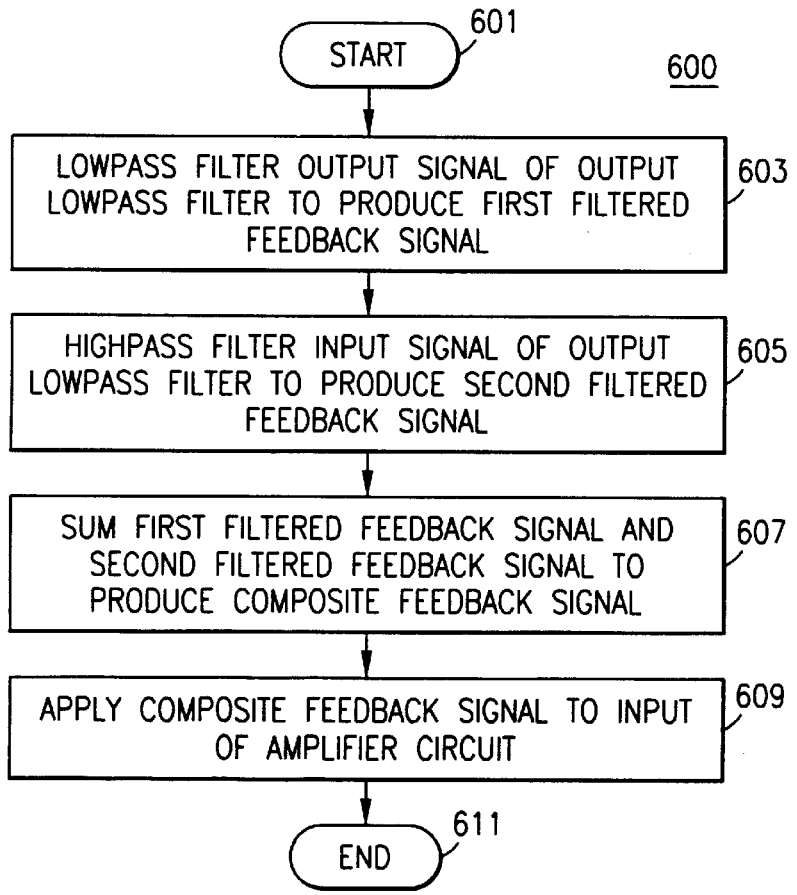
FIG. 6 is a logic flow diagram of steps executed to provide negative feedback to an amplifier circuit in accordance with the present invention.

FIG. 6 is a logic flow diagram 600 of steps executed to provide negative feedback to an amplifier circuit in accordance with the present invention. The amplifier circuit includes a forward path and a feedback path, wherein the forward path includes at least one amplifier (e.g., an error amplifier and an output amplifier) operably coupled to an output lowpass filter as preferably depicted in FIGS. 4 and 5, and described above. The logic flow begins (601) when the output signal of the output lowpass filter is lowpass filtered (603) to produce a first filtered feedback signal. In addition, the input signal of the output lowpass filter is highpass filtered (605) to produce a second filtered feedback signal. The filtered feedback signals are then appropriately summed (607) (e.g., via a summing node) to produce a composite feedback signal. The composite feedback signal is applied (609) to an input of the amplifier circuit to thereby provide negative feedback to the amplifier circuit and end (611) the logic flow. As discussed above, the composite feedback signal consists primarily of the lowpass-filtered feedback signal at low frequencies and consists primarily of the high-pass filtered feedback signal at high frequencies. Consequently, by filtering and combining feedback signals in the above-described manner, the feedback method of the present invention selectively includes the output lowpass filter in the feedback loop of the amplifier circuit for a first range of frequencies (i.e., frequencies below a common cutoff frequency of the feedback filters) and selectively excludes the output lowpass filter from the feedback loop for a second range of frequencies (i.e., frequencies above the common cutoff frequency of the feedback filters) to enable the feedback loop to correct non-ideal behavior of the output lowpass filter at low frequencies, without adversely impacting the overall stability of the amplifier circuit.

Those of ordinary skill will appreciate that although the logic flow diagram 600 suggests that the output signal of the output lowpass filter is lowpass-filtered before the input signal to the output lowpass filter is highpass-filtered, such is not actually the case. Rather, the lowpass filtering (603) of the output signal of the output lowpass filter and the highpass filtering (605) of the input signal to the output lowpass filter occur substantially simultaneously and any order of such filtering should not be implied from the logic flow diagram 600.

The present invention encompasses an amplifier circuit that includes negative feedback and a method for providing negative feedback to an amplifier circuit. With this invention, performance of class D amplifiers can be improved at low frequencies by including negative feedback to reduce the amplifier's output impedance and distortion, without compromising the amplifier's bandwidth and/or stability. In contrast to prior art feedback techniques that either completely exclude the output lowpass filter from the feedback loop or completely include the output lowpass filter in the feedback loop and attempt to compensate for the phase shift and amplitude peaking introduced by the filter, the present invention selectively includes the output filter in and excludes the output filter from the feedback loop to obtain improved amplifier performance. By selectively including the output filter in the feedback loop at low frequencies, the present invention allows the feedback loop to correct any non-ideal behavior of the output lowpass filter, thereby improving overall amplifier performance as compared to amplifiers that merely exclude the output filter from the feedback loop altogether. By selectively excluding the output filter from the feedback loop at high frequencies, the present invention insures stable operation of the negative feedback amplifier circuit for all frequencies at which the amplifier circuit has positive gain.

While the foregoing constitute certain preferred and alternative embodiments of the present invention, it is to be understood that the invention is not limited thereto and that in light of the present disclosure, various other embodiments will be apparent to persons skilled in the art. Accordingly, it is to be recognized that changes can be made without departing from the scope of the invention as particularly pointed out and distinctly claimed in the appended claims which shall be construed to encompass all legal equivalents thereof.

What is claimed is:

1. An amplifier circuit for driving a load, the amplifier circuit comprising:

at least one amplifier stage that receives an input signal and amplifies the input signal to produce at least one amplified signal;

a first lowpass filter, operably coupled between an output of the at least one amplifier stage and the load;

a highpass filter, operably coupled to an input of the first lowpass filter, the highpass filter producing a first filtered feedback signal;

a second lowpass filter, operably coupled to an output of the first lowpass filter, the second lowpass filter producing a second filtered feedback signal, the second lowpass filter having a cutoff frequency which is substantially lower than a cutoff frequency of said first lowpass filter; and a summing arrangement, operably coupled to the second lowpass filter, the highpass filter, and an input of the at least one amplifier stage, that combines the first filtered feedback signal and the second filtered feedback signal to produce a composite feedback signal, the composite feedback signal being combined with the input signal to apply negative feedback to the at least one amplifier stage.

2. The amplifier circuit of claim 1, wherein a cutoff frequency of the highpass filter is substantially lower than a cutoff frequency of the first lowpass filter.

3. The amplifier circuit of claim 1, wherein a cutoff frequency of the second lowpass filter is substantially equal to a cutoff frequency of the highpass filter.

4. The amplifier circuit of claim 1, wherein an order of the first lowpass filter is greater than two.

5. The amplifier circuit of claim 1, wherein the amplifier circuit is a class D audio amplifier circuit.

6. The amplifier circuit of claim 1, wherein the at least one amplified signal comprises a single-ended amplified signal, the amplifier circuit further comprising:

a first voltage divider and a first buffer amplifier coupled in series between the input of the first lowpass filter and the highpass filter; and a second voltage divider and a second buffer amplifier coupled in series between the output of the first lowpass filter and the second lowpass filter.

7. The amplifier circuit of claim 6, further comprising:
a third buffer amplifier coupled between the second lowpass filter and the summing arrangement.

8. The amplifier circuit of claim 7, further comprising:
a third lowpass filter coupled between the first voltage divider and the first buffer amplifier.

9. The amplifier circuit of claim 1, wherein the at least one amplified signal comprises two balanced amplified signals and the first lowpass filter includes two inputs, the amplifier circuit further comprising:
a third lowpass filter coupled to a first input of the first lowpass filter;
a fourth lowpass filter coupled to a second input of the first lowpass filter; and
a first differential amplifier coupled to an output of the third lowpass filter, an output of the fourth lowpass filter, and an input of the highpass filter.

10. The amplifier circuit of claim 9, wherein the first lowpass filter includes two outputs, the amplifier circuit further comprising:
a second differential amplifier coupled to a first output of the first lowpass filter, a second output of the first lowpass filter, and an input of the second lowpass filter.

11. The amplifier circuit of claim 9, further comprising:
a buffer amplifier coupled between the second lowpass filter and the summing arrangement.

12. An amplifier circuit for driving a load, the amplifier circuit comprising:
at least one amplifier stage that receives an input signal and amplifies the input signal to produce single-ended amplified signal;
an output lowpass filter, operably coupled between an output of the at least one amplifier stage and the load;
a first voltage divider coupled to an input of the output lowpass filter;
a first buffer amplifier operably coupled to an output of the first voltage divider;
a feedback highpass filter, coupled to an output of the first buffer amplifier, the feedback highpass filter producing a first filtered feedback signal;
a second voltage divider coupled to an output of the output lowpass filter;
a second buffer amplifier operably coupled to an output of the second voltage divider;
a feedback lowpass filter, operably coupled to an output of the second buffer amplifier, the feedback lowpass filter producing a second filtered feedback signal; and
a summing arrangement, operably coupled to the feedback lowpass filter, the feedback highpass filter, and an input of the at least one amplifier stage, that combines the first filtered feedback signal and the second filtered feedback signal to produce a composite feedback signal, the composite feedback signal being combined with the input signal to apply negative feedback to the amplifier circuit.

13. The amplifier circuit of claim 12, further comprising:
a third buffer amplifier coupled between the feedback lowpass filter and the summing arrangement.

14. An amplifier circuit for driving a load, the amplifier circuit comprising:
at least one amplifier stage that receives an input signal and amplifies the input signal to produce two balanced amplified signals;
an output lowpass filter, operably coupled between an output of the at least one amplifier stage and the load, the output lowpass filter including two inputs and two outputs;
a first differential amplifier operably coupled to a first input of the output lowpass filter and a second input of the output lowpass filter;
a feedback highpass filter, coupled to an output of the first differential amplifier, that produces a first filtered feedback signal;
a second differential amplifier coupled to a first output of the output lowpass filter and a second output of the output lowpass filter;
a feedback lowpass filter, operably coupled to an output of the second differential amplifier, that produces a second filtered feedback signal; and
a summing arrangement, operably coupled to the feedback lowpass filter, the feedback highpass filter, and an input of the at least one amplifier stage, that combines the first filtered feedback signal and the second filtered feedback signal to produce a composite feedback signal, the composite feedback signal being combined with the input signal to thereby apply negative feedback to the amplifier circuit.

15. The amplifier circuit of claim 14, further comprising:
a buffer amplifier coupled between the feedback lowpass filter and the summing arrangement.

16. The amplifier circuit of claim 14, further comprising:
a first lowpass filter coupled between the first input of the output lowpass filter and the first differential amplifier; and
a second lowpass filter coupled between the second input of the output lowpass filter and the first differential amplifier.

17. An improved class D amplifier circuit that includes an error amplifier, a pulse width modulator, an output amplifier stage, and an output lowpass filter, the class D amplifier circuit utilizing a negative feedback loop to at least reduce an output impedance of the amplifier circuit, wherein the improvement comprises:
a feedback arrangement that includes a highpass filter, a lowpass filter, and a summing arrangement, the highpass filter being operably coupled between an input of the output lowpass filter and the summing arrangement, and the lowpass filter being operably coupled between an output of the output lowpass filter and the summing arrangement, such that the output lowpass filter is included in the negative feedback loop for a first range of frequencies and is excluded from the negative feedback loop for a second range of frequencies.

18. The amplifier circuit of claim 1, wherein said at least one amplifier stage comprising:
an output stage having an output stage input;
a pulse width modulator having a pulse width modulator input and a pulse width modulator output, said pulse width modulator output being operably coupled to said output stage input, and
an error amplifier operably coupled between the summing arrangement and the pulse width modulator input, said error amplifier having an error amplifier output, a first error amplifier input operably coupled to said summing arrangement for receiving the composite feedback signal from the summing arrangement, and a second error amplifier input that receives the input signal.

* * * * *